United States Patent
Hashimoto et al.

(10) Patent No.: US 10,533,657 B2
(45) Date of Patent: Jan. 14, 2020

(54) WIRING UNIT

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Kana Hashimoto, Mie (JP); Kosuke Sone, Mie (JP); Mitsuhiro Shimamura, Mie (JP); Tadashi Goto, Mie (JP); Masashi Tanifuji, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 15/973,988

(22) Filed: May 8, 2018

(65) Prior Publication Data

US 2018/0363770 A1 Dec. 20, 2018

(30) Foreign Application Priority Data

Jun. 14, 2017 (JP) ................................ 2017-117085

(51) Int. Cl.
| | | |
|---|---|---|
| *H02G 3/08* | (2006.01) | |
| *H02G 3/03* | (2006.01) | |
| *F16H 61/00* | (2006.01) | |
| *H05K 1/18* | (2006.01) | |
| *F15B 21/044* | (2019.01) | |
| *B60R 16/02* | (2006.01) | |

(52) U.S. Cl.
CPC ....... *F16H 61/0006* (2013.01); *B60R 16/0215* (2013.01); *F15B 21/044* (2013.01); *H05K 1/181* (2013.01); *H05K 2201/10356* (2013.01)

(58) Field of Classification Search
CPC ... B60R 16/00; B60R 16/0215; B60R 16/005; B60R 16/02; B60R 16/0207; B60R 16/0239; B60R 16/23; B60R 11/00; B60R 16/023; F15B 21/044; F15B 21/00; H05K 1/181; H05K 5/00; H05K 5/02; H05K 5/0004; H05K 5/04; H05K 2201/10356; H05K 2201/10431; F16H 57/04; F16H 61/00; F16H 61/006; F16H 61/06; H02G 3/08; H02G 3/03; H02G 3/081
USPC ... 174/72 A, 50, 520, 535, 17 VA, 522, 559, 174/560, 561, 562; 439/76.1, 76.2; 361/600, 601, 679.01, 677, 678, 688, 676
See application file for complete search history.

(56) References Cited

U.S. PATENT DOCUMENTS 6,008,454 A * 12/1999 Kawakita ............... H02G 3/088
174/547
6,462,270 B1 * 10/2002 Depp ..................... H02G 3/081
174/50

(Continued)

*Primary Examiner* — Angel R Estrada
(74) *Attorney, Agent, or Firm* — Honigman LLP

(57) ABSTRACT

Provided is a wiring unit in which oil bubbles are prevented from being generated. A wiring unit includes: a wire harness; and a rectifying member that is located above the wire harness and is provided with a rectifying plate that is located inside a through hole that penetrates through the rectifying member in a top-bottom direction, and that has a plate surface that is inclined relative to a vertical direction.

17 Claims, 9 Drawing Sheets

(56) References Cited

U.S. PATENT DOCUMENTS

| | | | | |
|---|---|---|---|---|
| 6,522,528 B2* | 2/2003 | Yamane | ............... | B60R 16/0238 |
| | | | | 361/601 |
| 6,768,054 B2* | 7/2004 | Sato | ....................... | H02G 3/088 |
| | | | | 174/50 |
| 7,122,738 B2* | 10/2006 | Kanamaru | ............ | H01R 13/518 |
| | | | | 174/50 |
| 7,189,918 B2* | 3/2007 | Sakata | ................. | B60R 16/0239 |
| | | | | 174/17 VA |
| 7,253,356 B2* | 8/2007 | Kiyota | ................... | H02G 3/081 |
| | | | | 174/17 R |
| 7,671,275 B2* | 3/2010 | Kubota | .............. | H01R 13/5227 |
| | | | | 174/17 R |
| 8,168,896 B2* | 5/2012 | Loibl | .................... | H01L 23/057 |
| | | | | 174/522 |
| 2016/0031390 A1 | 2/2016 | Kawashima et al. | | |
| 2018/0361958 A1* | 12/2018 | Sone | ................... | B60R 16/0215 |

* cited by examiner

WIRING UNIT

CROSS-REFERENCE TO RELATED APPLICATIONS

This application claims priority of Japanese Patent Application No. JP 2017-117085 filed Jun. 14, 2017.

TECHNICAL FIELD

The technology disclosed in the present specification relates to a wiring unit that is used under circumstances in which oil flows down.

BACKGROUND

Conventionally, a wire harness that is connected to devices for controlling or executing transmission operations is routed in an automatic transmission of a vehicle. This wire harness includes a plurality of electrical wires that are tied together using a binding member or the like. A wire harness disclosed in JP 2014-199069A is known as an example of such a wire harness.

SUMMARY

Oil such as ATF (Automatic Transmission Fluid) circulates in the automatic transmission. Oil may flow down to the wire harness from above the wire harness, depending on the location of the wire harness in the automatic transmission. As described above, the wire harness includes a plurality of electrical wires that are tied together. Therefore, the wire harness has an uneven surface that is complex due to the outer circumferential surfaces of the plurality of electrical wires. Thus, oil that has flowed down to the wire harness splashes due to the complex uneven surface of the wire harness. Occasionally, such splashes of oil may gather into oil droplets, and furthermore, such oil droplets may form oil bubbles by enclosing air while falling down into oil that is retained in a lower part of the automatic transmission.

An oil bubble is air that is enclosed in an oil film. Therefore, if such oil bubbles are formed, there is a problem in which it is difficult to control oil pressure. This is because air in oil bubbles contracts and reduces the pressure that is applied to oil.

The technology disclosed in the present specification has been completed in view of the above-described situation, and aims to provide a wiring unit in which oil bubbles are prevented from being generated.

The technology disclosed in the present specification provides a wiring unit that includes: a wire harness; and a rectifying member that is located above the wire harness and is provided with a rectifying plate that is located inside a through hole that penetrates through the rectifying member in a top-bottom direction, and that has a plate surface that is inclined relative to a vertical direction.

With the above-described configuration, oil that falls onto the rectifying member from above enters the through hole of the rectifying member from above, and flows down to the rectifying plate. Consequently, the force of the oil that has flowed down to the rectifying plate from above is reduced by the rectifying plate, and the oil is rectified so as to flow down in a direction that is inclined relative to the vertical direction. Thus, compared to cases in which the rectifying member is not provided, oil flows down to the wire harness at a smaller flowing speed in a direction that is inclined relative to the vertical direction. Therefore, air is prevented from being enclosed in oil, and accordingly oil bubbles are prevented from being generated.

The following are preferable modes in which the technology disclosed in the present specification is carried out.

Preferably, the wire harness is routed on a wiring board, and the wiring board is provided with an inclined portion that protrudes outward from a side edge of the wiring board and has an inclined surface that is inclined downward in a direction toward a leading end of the inclined portion.

With the above-described configuration, oil that has flowed down to the wiring board and has reached the inclined portion flows down along the inclined surface of the inclined portion. Thus, compared to cases in which oil flows down from the wiring board in the vertical direction, the speed at which oil flows down can be reduced. As a result, when oil flows down from above into the oil that is retained below the wiring board, oil bubbles are prevented from being generated due to air being enclosed in oil.

Preferably, oil is retained below the wiring board, and the inclined portion is provided with a flow moderation portion that dangles from the leading end of the inclined portion and whose lower end portion is located in the oil.

With the above-described configuration, the oil that has flowed down to the leading end of the inclined portion flows down along the surface of the flow moderation portion and flows into the oil that is retained below the wiring board. At this time, since a lower end portion of the flow moderation portion is located in the oil, the oil that has flowed down along the surface of the flow moderation portion is prevented from enclosing air at the oil surface of the oil that is retained below the wiring board. As a result, it is possible to reliably prevent oil bubbles from being generated.

Preferably, a routing portion, on which the wire harness is routed, of the wiring board is provided with a guide inclined surface that is inclined downward in a direction toward a portion of the wiring board, the portion being provided with the inclined portion.

With the above-described configuration, the oil that has flowed down to the wiring board flows along the guide inclined surface, and is swiftly guided to the inclined portion. Thus, oil is prevented from being retained on the upper surface of the wiring board. Therefore, oil is prevented from flowing down from a side edge where the inclined portion is not provided, from among the side edges of the wiring board. As a result, oil bubbles are prevented from being generated due to air being enclosed in the oil that has flowed down from the side edge where the inclined portion is not provided, from among the side edges of the wiring board.

Preferably, the wire harness includes a plurality of electrical wires, and the plurality of electrical wires are routed in a direction in which oil flows.

With the above-described configuration, the oil that has flowed down to the wire harness gently flows along gaps between the plurality of electrical wires. Thus, when oil flows on the wiring board, oil bubbles are prevented from being generated due to air being enclosed in oil.

Preferably, a filter is provided above the wire harness.

With the above-described configuration, oil bubbles contained in the oil that falls onto the filter are removed by the filter, and therefore, oil from which oil bubbles have been removed flows down from below the filter. Thus, it is possible to reduce the number of oil bubbles contained in the oil.

Preferably, the filter is disposed between the rectifying member and the wire harness.

As the filter is disposed below the rectifying member, the oil that flows down to the filter is first decelerated by the rectifying plate of the rectifying member. Consequently, the flowing speed of oil is small when the oil comes into contact with the filter. Therefore, air is prevented from being enclosed in oil due to oil coming into contact with the filter. As a result, oil bubbles are prevented from being generated. Also, oil is further decelerated upon passing through the filter. Therefore, when oil flows down to the wire harness that is located below the filter, air is further prevented from being enclosed in oil. As a result, oil bubbles are further prevented from being generated.

Preferably, the filter is attached to a frame that includes an outer frame and a bar that is provided inside the outer frame.

With the above-described configuration, the outer frame and the bar retain the shape of the filter. Therefore, the filter is prevented from deforming due to the pressure of the oil that has flowed down. Thus, it is possible to reliably reduce the number of oil bubbles contained in the oil.

The technology disclosed in the present specification prevents oil bubbles from being generated.

DETAILED DESCRIPTION OF PREFERRED EMBODIMENTS

Figure 1:
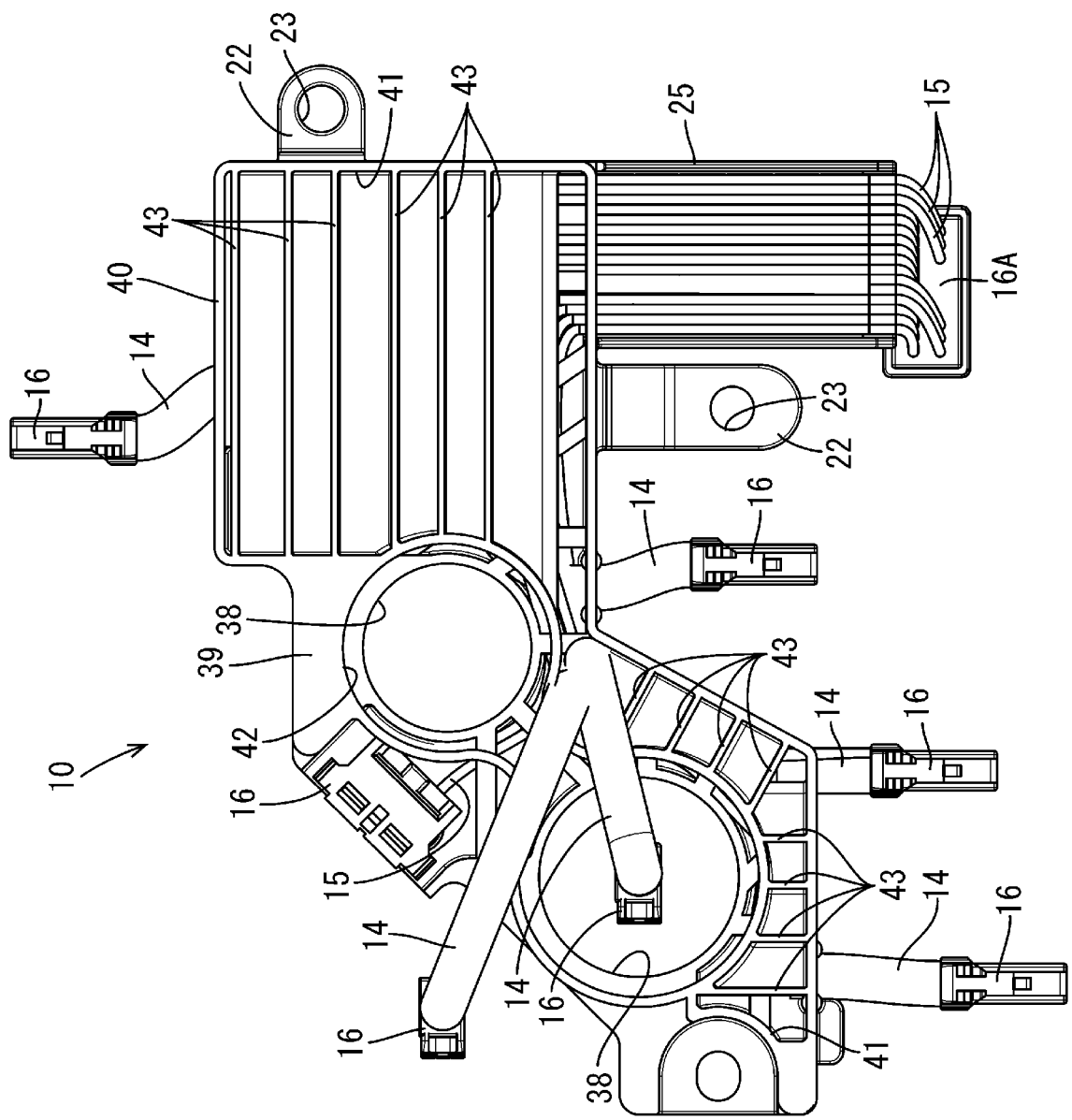
FIG. 1 is a plan view showing a wiring unit according to a first embodiment.
Figure 2:
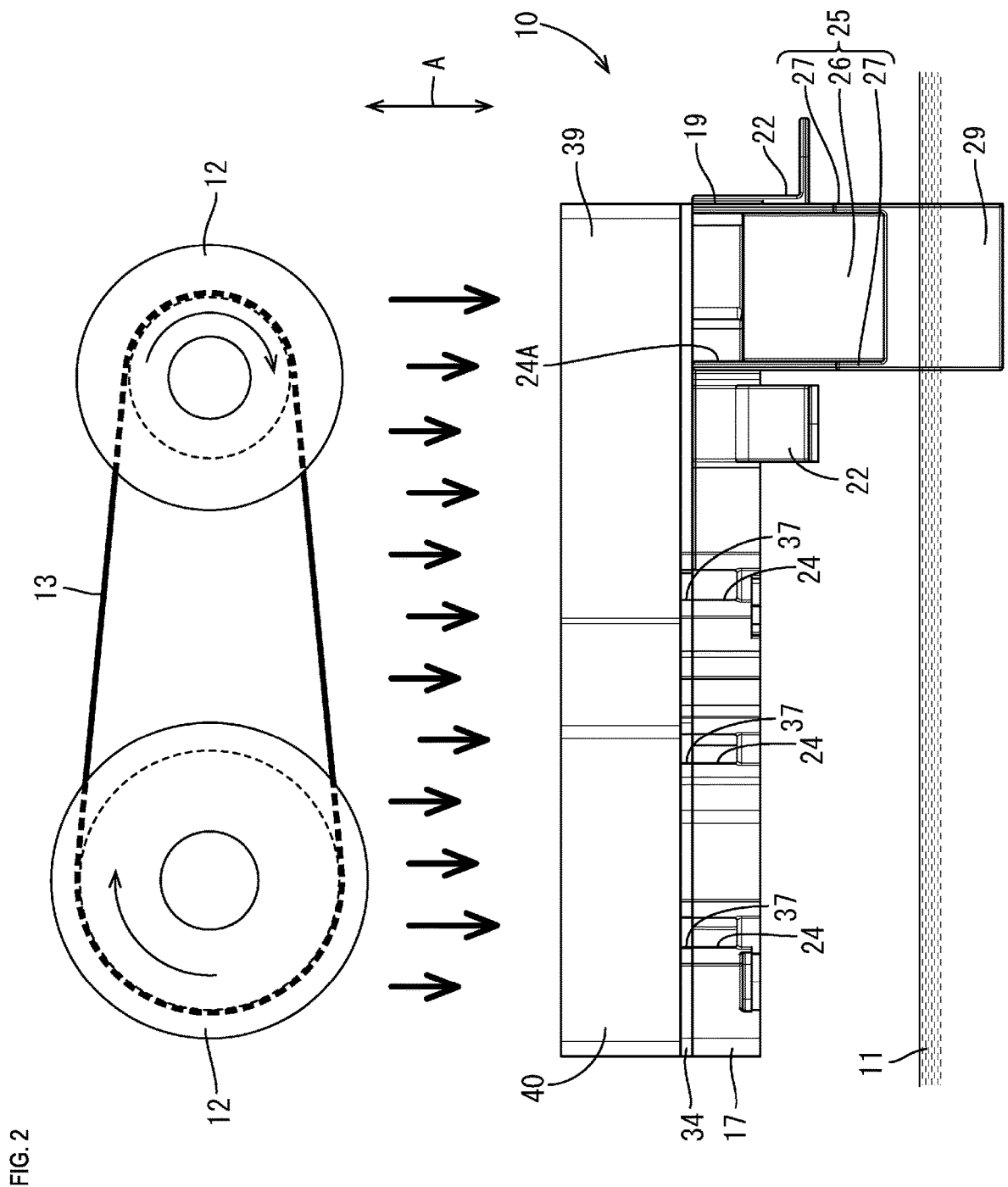
FIG. 2 is a front view schematically showing the wiring unit disposed in an automatic transmission.

The following describes a first embodiment in which the technology disclosed in the present specification is applied to a wiring unit 10, with reference to FIGS. 1 to 10. The wiring unit 10 according to the present embodiment is disposed in an automatic transmission (not shown) that is mounted on a vehicle (not shown). The wiring unit 10 is located at a position to which oil 11 that circulates in the automatic transmission falls from above. As shown in FIG. 2, in the present embodiment, the wiring unit 10 is located below a pair of pulleys 12 that are included in an automatic transmission, and a belt 13 that is stretched between the pair of pulleys 12. In the following description, the direction indicated by an arrow A is denoted as a top-bottom direction. Also, regarding a plurality of members that are the same, only some of the members are assigned reference numerals and the reference numerals of the other members are omitted in some cases.

Wire Harness 14

The wiring unit 10 includes a wire harness 14. The wire harness 14 includes a plurality of electrical wires 15 that are tied together using a binding member such as a piece of tape (not shown). Connectors 16 are connected to end portions of the electrical wires 15. Each electrical wire 15 has a substantially circular cross section. Therefore, the wire harness 14, which includes a plurality of electrical wires 15 that are tied together, has an uneven surface that is complex due to the external shapes of the plurality of electrical wires 15.

Wiring Board 17

The wire harness 14 is routed on a wiring board 17. As the material of the wiring board 17, any material such as a synthetic resin or metal can be selected as appropriate. The wiring board 17 according to the present embodiment is made of an insulative synthetic resin.

The wiring board 17 includes a bottom wall 18 and a side wall 19 that stands upright from a side edge of the bottom wall 18. A routing portion 20, on which the wire harness 14 is mounted and routed, is provided on the upper surface of the bottom wall 18. The bottom wall 18 has a plurality of (two in the present embodiment) releasing holes 21 that penetrate through the bottom wall 18 in the top-bottom direction so that electrical components (not shown) that are disposed in the automatic transmission are prevented from interfering with each other.

Bracket portions 22 for fixing the wiring board 17 in the automatic transmission are formed on the side wall 19 of the wiring board 17 so as to protrude outward. Each bracket portion 22 protrudes obliquely downward from the wiring board 17, and an insertion hole 23, through which a bolt (not shown) is inserted, is provided in a leading end portion of each bracket portion 22 so as to penetrate therethrough in the top-bottom direction. The wiring board 17 is fixed to the automatic transmission with bolts being inserted into the insertion holes 23.

The side wall 19 of the wiring board 17 is provided with a plurality of discharge ports 24 for discharging oil 11 that falls from above. Each discharge port 24 is shaped like a cutout extending downward from an upper edge portion of the side wall 19.

Among the discharge ports 24, a discharge port 24 at the right end of FIG. 2 is denoted as a main discharge port 24A, which has the largest opening among the plurality of discharge ports 24. A portion of the bottom wall 18 of the wiring board 17, the portion being provided with the main discharge port 24A, is provided with an inclined portion 25 that protrudes outward from a side edge of the wiring board 17 and is inclined downward in a direction toward the leading end of the inclined portion 25. The inclined portion 25 has a groove shape, and includes a bottom wall 26 and side walls 27 that stand upright from side edges of the bottom wall 26. An inclined surface 28, which is inclined downward in a direction toward the leading end of the inclined portion 25, is formed on the upper surface of the bottom wall 26 of the inclined portion 25. Each side wall 27 of the inclined portion 25 is continuous with the side wall 19 of the wiring board 17.

The inclined portion 25 is provided with a flow moderation portion 29 that hangs from a lower end portion of the inclined portion 25. The flow moderation portion 29 is continuous with the bottom wall 26 of the inclined portion 25. As shown in FIG. 2, oil 11 is retained below the wiring board 17 in the automatic transmission. Oil 11 is circulated in the automatic transmission by a pump (not shown). FIG. 2 shows a state in which the wiring board 17 is fixed in the automatic transmission and a lower end portion of the flow moderation portion 29 is located in oil 11 retained in the automatic transmission. In other words, in FIG. 2, the lower end portion of the flow moderation portion 29 is located below the surface of oil 11. Note that there are cases in which the lower end portion of the flow moderation portion 29 is not located in oil 11, depending on the amount of oil 11 circulating in the automatic transmission, oil pressure, unevenness of the distribution of oil 11, and so on.

The electrical wires 15, which branch off from the wire harness 14, are led out of the wiring board 17 through the plurality of discharge ports 24 provided in the wiring board 17. Edges of the side wall 19, which define the discharge ports 24 (excluding the main discharge port 24A), have curved surfaces. Thus, the electrical wires 15 of the wire harness 14 are prevented from being damaged even when the edges of the side wall 19, which define the discharge ports 24, come into contact with the wire harness 14.

A plurality of electrical wires 15 that are led out of the wire harness 14 are mounted on the inclined surface 28 of the inclined portion 25. The plurality of electrical wires 15 are mounted on the inclined surface 28 such that the electrical wires 15 spread in the width direction of the inclined surface 28 (a left-right direction in FIG. 4). A connector 16A is connected to leading ends of the electrical wires 15 that are routed on the inclined portion 25. The connector 16A is attached to the flow moderation portion 29 using a well-known lock mechanism (not shown).

Filter 30

Figure 3:
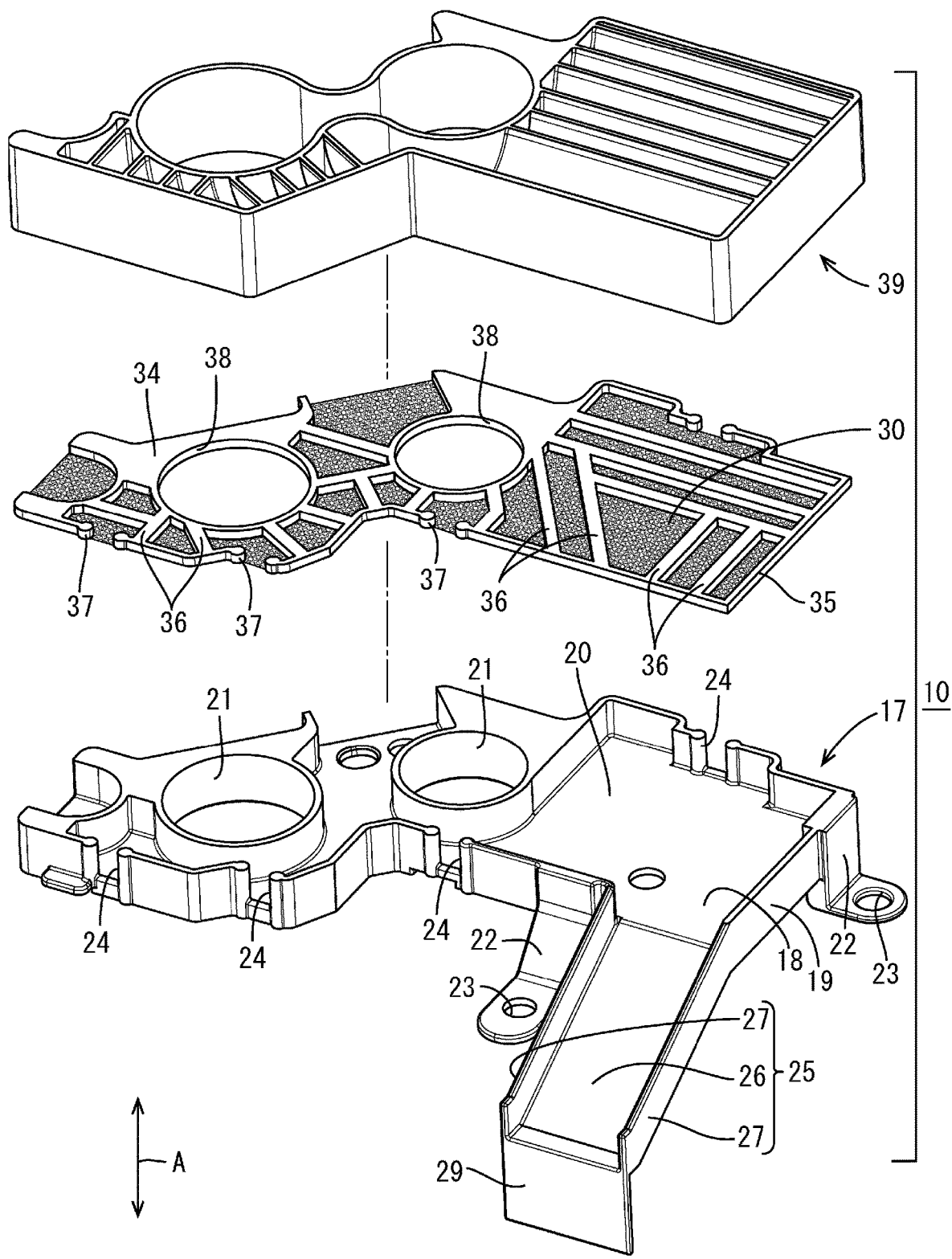
FIG. 3 is an exploded perspective view showing the wiring unit from which a wire harness is omitted.
Figure 4:
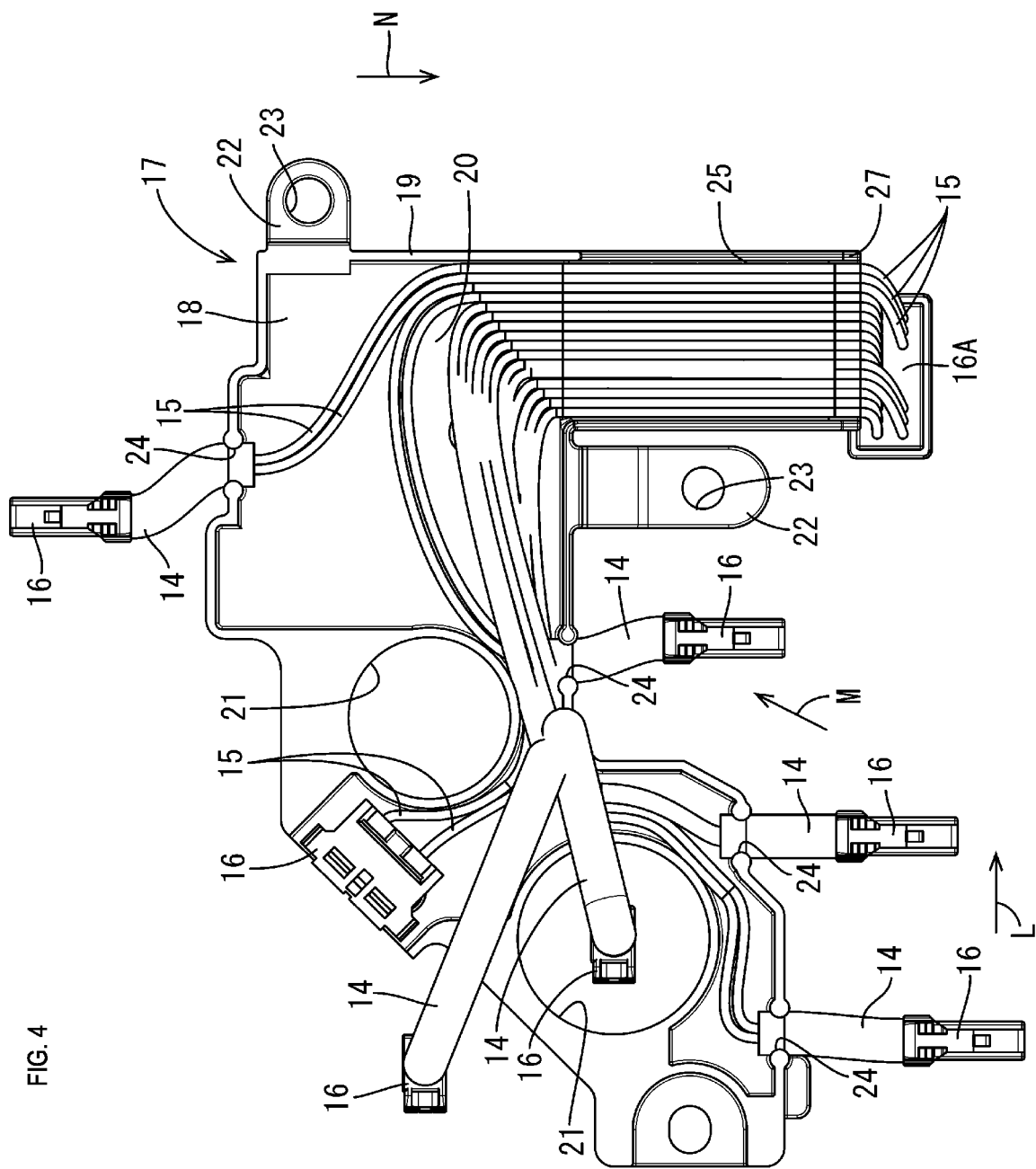
FIG. 4 is a plan view showing the wiring unit in a state where a rectifying member is detached.

As shown in FIG. 3, a filter 30 is disposed above the wire harness 14. The filter 30 has the shape of a film, a sheet, or a plate. The filter 30 is provided with a plurality of communication holes 31 that allow an area above the filter 30 and an area below the filter 30 to be in communication with each other. Thus, the filter 30 is configured to filter out oil bubbles from oil 11 while oil 11 is distributed from the upper area to the lower area through the filter 30.

As the material of the filter 30, any material such as a synthetic resin or metal can be selected as appropriate. As a synthetic resin for forming the filter 30, any material may be selected as appropriate, from among, for example, a polyolefin such as polypropylene, a polyethylene such as polybutylene terephthalate, a polyamide such as nylon 6,6, and a fluororesin such as polytetrafluoroethylene. As a filter 30 that is made of a fluororesin, POREFLON (registered trademark, manufactured by Sumitomo Electric Industries, Ltd.) can be used, for example. As an example of a metal for forming the filter 30, any material may be selected as appropriate, from among, for example, stainless steel, nickel, chromium, and a nickel-chromium alloy. As a filter 30 that is made of a metal, Celmet (registered trademark, manufactured by Sumitomo Electric Industries, Ltd.) can be preferably used.

Figure 9:
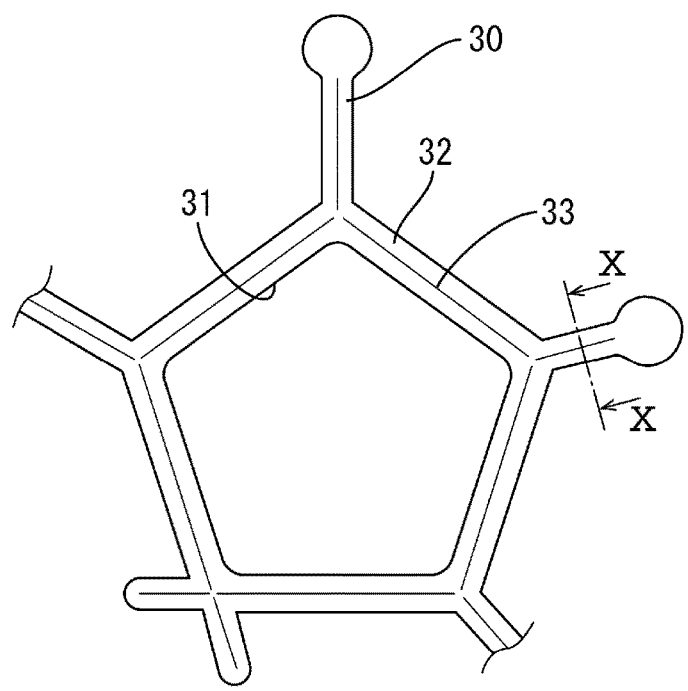
FIG. 9 is a partially-enlarged schematic view of a filter.
Figure 10:
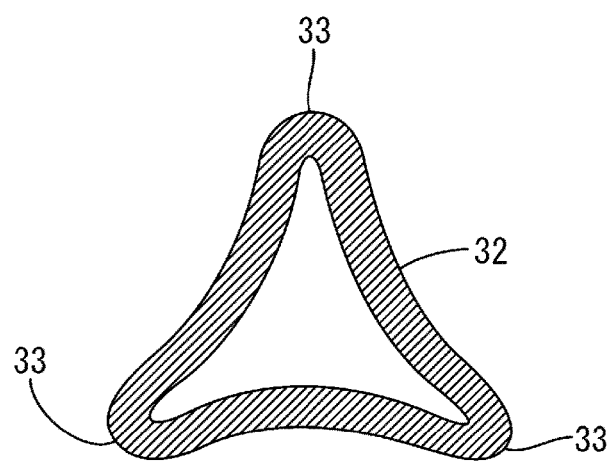
FIG. 10 is a cross-sectional view along a line X-X in FIG. 9.

As shown in FIG. 9, Celmet is constituted by skeletons 32 that each have a polygonal cross section. Therefore, if Celmet is used as the filter 30, oil bubbles in oil 11 are filtered out by Celmet, and rupture upon coming into contact with ridges 33 of the skeletons 32 that constitute Celmet.

The filter 30 is attached to a frame 34. As the material of the frame 34, any material such as a synthetic resin or metal can be selected as appropriate. The frame 34 may be formed integrally with the filter 30. Alternatively, the frame 34 and the filter 30 may be formed as separate members, and the filter 30 and the frame 34 may be fixed to each other using a well-known technique such as adhesive bonding, welding, or screwing.

The frame 34 includes an outer frame 35 and bars 36 that are provided inside the outer frame 35. The bars 36 reinforce the outer frame 35. The outer frame 35 is provided with discharge ports 37 that are located at positions that correspond to the positions of the discharge ports 24 provided in the wiring board 17. The frame 34 is also provided with a plurality of (two in the present embodiment) releasing holes 38 that penetrate through the frame 34 in the top-bottom direction, at positions above the releasing holes 21 provided in the wiring board 17.

Rectifying Member 39

A rectifying member 39 is provided above the wire harness 14 and the filter 30. As the material of the rectifying member 39, any material such as a synthetic resin or metal can be selected as appropriate. The rectifying member 39 according to the present embodiment is made of an insulative synthetic resin.

The rectifying member 39 includes an outer frame 40 and a through hole 41 that is surrounded by the outer frame 40 and penetrates through the rectifying member 39 in the top-bottom direction. The rectifying member 39 is also provided with one releasing hole 42 that penetrates through the rectifying member 39 in the top-bottom direction, at a position above the releasing holes 21 of the wiring board 17 and the releasing holes 38 of the filter 30.

The filter 30 is sandwiched between the wiring board 17 and the rectifying member 39. The wiring board 17 and the rectifying member 39 are assembled into one piece using a well-known technique such as employing a lock structure composed of a lock portion and a lock receiver portion, adhesive bonding, thermal welding, or screwing. The filter 30 may be fixed to the wiring board 17, or fixed to the rectifying member 39, or fixed between the wiring board 17 and the rectifying member 39 with the wiring board 17 and the rectifying member 39 being fixed to each other.

Figure 5:
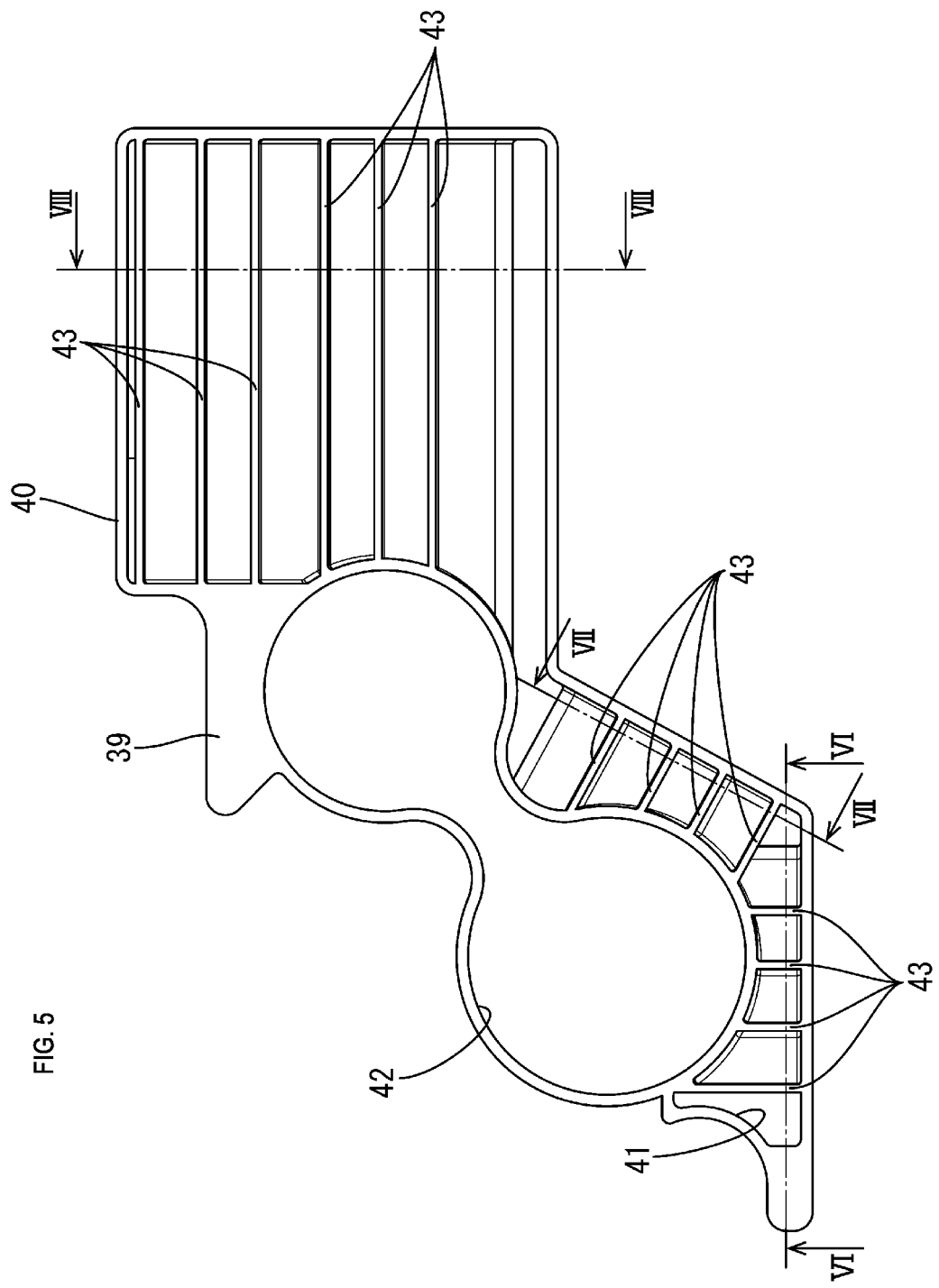
FIG. 5 is a plan view showing the rectifying member.

As shown in FIG. 5, a plurality of rectifying plates 43 that each have a plate shape are provided inside the through hole 41 of the rectifying member 39, integrally with the outer frame 35. Each of the plurality of rectifying plates 43 has a plate surface that is inclined relative to the vertical direction (the direction of gravity). Thus, each of the rectifying plates 43 stands to extend roughly in the top-bottom direction, and has an upper surface that faces upward relative to the vertical direction and a lower surface that faces downward relative to the vertical direction. Each of the rectifying plates 43 is provided such that a lower end portion thereof is located forward of an upper end portion thereof in the direction in which oil 11 flows along the upper surface of the bottom wall 18 of the wiring board 17.

As shown in FIG. 3, the wiring board 17 is provided with the main discharge port 24A. Oil 11 that flows along the upper surface of the bottom wall 18 of the wiring board 17 is mainly discharged from the main discharge port 24A. Therefore, most of the oil 11 flows in the directions indicated by an arrow L, an arrow M, and an arrow N in FIG. 4 along the upper surface of the bottom wall 18 of the wiring board 17, and is discharged from the main discharge port 24A. Note that the technology disclosed in the present specification does not exclude cases in which oil 11 is discharged from a discharge port 24 other than the main discharge port 24A.

Figure 6:
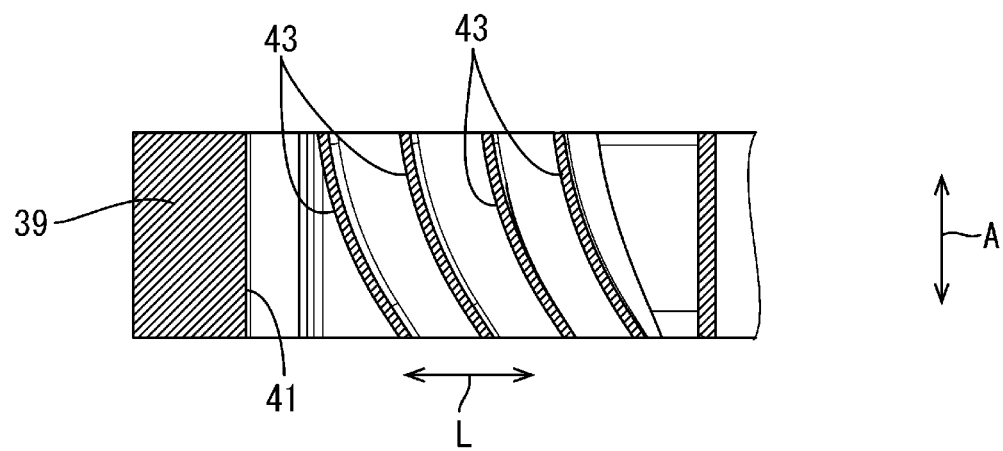
FIG. 6 is a cross-sectional view along a line VI-VI in FIG. 5.

FIG. 6 discloses a configuration in which lower end portions of the rectifying plates 43 are located on the right, in FIG. 6, of upper end portions of the rectifying plates 43. In the area shown in FIG. 6, most of the oil 11 flows in the direction indicated by the arrow L (to the right in FIG. 6) along the upper surface of the bottom wall 18 of the wiring board 17. In side view, a lower portion of each rectifying plate 43 protrudes so as to have a curved shape. In the area shown in FIG. 6, each rectifying plate 43 has a different curvature.

Figure 7:
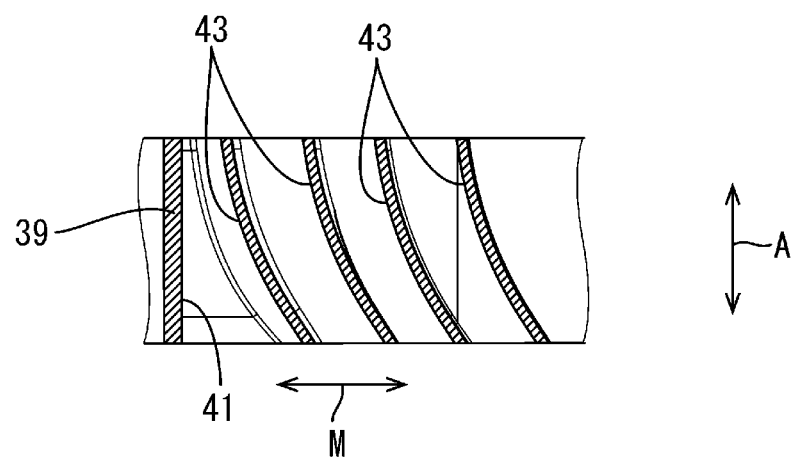
FIG. 7 is a cross-sectional view along a line VII-VII in FIG. 5.

Similarly, FIG. 7 discloses a configuration in which lower end portions of the rectifying plates 43 are located on the right, in FIG. 7, of upper end portions of the rectifying plates 43. In the area shown in FIG. 7, most of the oil 11 flows in the direction indicated by the arrow M (to the right in FIG. 7) along the upper surface of the bottom wall 18 of the wiring board 17. In side view, each a lower portion of each rectifying plate 43 protrudes so as to have a curved shape. In the area shown in FIG. 7, each rectifying plate 43 has a different curvature.

Figure 8:
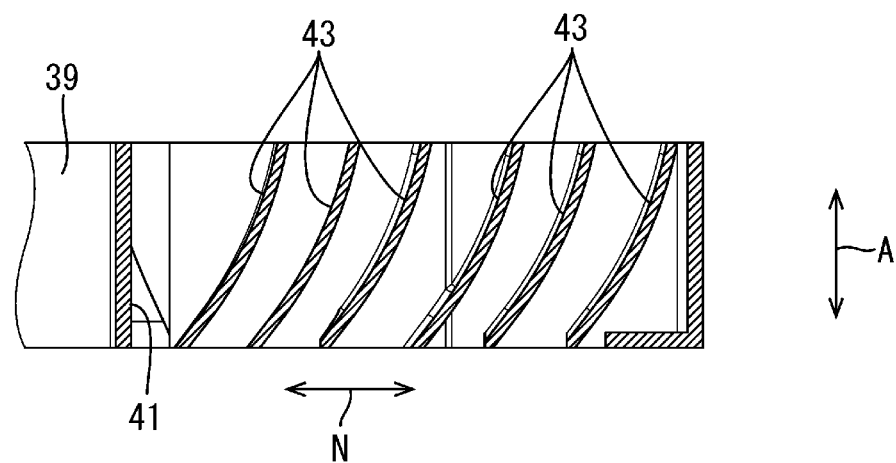
FIG. 8 is a cross-sectional view along a line VIII-VIII in FIG. 5.

FIG. 8 discloses a configuration in which lower end portions of the rectifying plates 43 are located on the left, in FIG. 8, of upper end portions of the rectifying plates 43. In the area shown in FIG. 8, most of the oil 11 flows in the direction indicated by the arrow N (to the left in FIG. 8) along the upper surface of the bottom wall 18 of the wiring board 17. In side view, a lower portion of each rectifying plate 43 protrudes so as to have a curved shape. In the area shown in FIG. 8, each rectifying plate 43 has substantially the same curvature.

Example of Assembly Process

The following describes an example of the process of assembling the wiring unit 10 according to the present embodiment. Note that the process of assembling the wiring unit 10 is not limited to the following description.

Metal terminal parts (not shown) are connected to end portions of the plurality of electrical wires 15, and the metal terminal parts are hosed in cavities (not shown) of the connectors 16 and 16A. The plurality of electrical wires 15 are tied together using a piece of tape or a binding member, to form the wire harness 14.

The wiring board 17 is formed through injection molding of an insulative synthetic resin material. The wire harness 14 is mounted on the routing portion 20 of the wiring board 17, and the plurality of electrical wires 15 are routed. Bundles of electrical wires, in each of which a plurality of electrical wires 15 are tied together, are led out of the discharge ports 24 and 24A of the wiring board 17. The connector 16A connected to the leading end of the bundle of electrical wires led out of the main discharge port 24A is attached to the flow moderation portion 29.

The frame 34 is formed through injection molding of an insulative synthetic resin material. The filter 30 is cut out into a predetermined shape, and is fixed to the frame 34 using an adhesive.

The rectifying member 39 is formed through injection molding of an insulative synthetic resin material.

The frame 34 is mounted on the wiring board 17 on which the wire harness 14 has been routed, and furthermore, the rectifying member 39 is stacked on the frame 34 so that the rectifying member 39 and the wiring board 17 are fixed integrally with each other. Thus, the wiring unit 10 is complete.

The wiring unit 10 is attached to the inside of the automatic transmission, using bolts inserted into the insertion holes 23 of the bracket portions 22. At this time, the wiring unit 10 is disposed in the automatic transmission such that the rectifying member 39 is located on the upper side.

Actions and Effects of Present Embodiment

The following describes the actions and the effects of the present embodiment. The wiring unit 10 according to the present embodiment includes: the wire harness 14; and the rectifying member 39 that is located above the wire harness 14 and is provided with the rectifying plates 43 that are located inside the through hole 41 that penetrates through the rectifying member 39 in the top-bottom direction, and that each have a plate surface that is inclined relative to the vertical direction.

With the above-described configuration, oil 11 that falls onto the rectifying member 39 from above enters the through hole 41 of the rectifying member 39 from above, and flows down onto the rectifying plates 43. Consequently, the force of the oil 11 that has flowed down onto the rectifying plates 43 from above is reduced by the rectifying plates 43, and the oil 11 is rectified so as to flow down in a direction that is inclined relative to the vertical direction. Thus, compared to cases in which the rectifying member 39 is not provided, oil 11 flows down to the wire harness 14 at a smaller flowing speed in a direction that is inclined relative to the vertical direction. Therefore, air is prevented from being enclosed in oil 11, and accordingly oil bubbles are prevented from being generated.

Also, according to the present embodiment, the wire harness 14 is routed on the wiring board 17, and the wiring board 17 is provided with the inclined portion 25 that protrudes outward from a side edge of the wiring board 17 and has the inclined surface 28 that is inclined downward in a direction toward the leading end of the inclined surface 28.

With the above-described configuration, oil 11 that has flowed down to the wiring board 17 and has reached the inclined portion 25 flows down along the inclined surface 28 of the inclined portion 25. Thus, compared to cases in which oil 11 flows down from the wiring board 17 in the vertical direction, the speed at which oil 11 flows down can be reduced. As a result, when oil 11 flows down from above into the oil 11 that is retained below the wiring board 17, oil bubbles are prevented from being generated due to air being enclosed in oil 11.

Also, according to the present embodiment, oil 11 is retained below the wiring board 17, and the inclined portion 25 is provided with the flow moderation portion 29 that hangs from the leading end of the inclined portion 25 and whose lower end portion is located in the oil 11.

With the above-described configuration, the oil 11 that has flowed down to the leading end of the inclined portion 25 flows down along the surface of the flow moderation portion 29 and flows into the oil 11 that is retained below the wiring board 17. At this time, since a lower end portion of the flow moderation portion 29 is located in the oil 11, the oil 11 that has flowed down along the surface of the flow moderation portion 29 is prevented from enclosing air at the oil surface of the oil 11 that is retained below the wiring board 17. As a result, it is possible to reliably prevent oil bubbles from being generated.

Also, according to the present embodiment, the wire harness 14 includes a plurality of electrical wires 15, and the plurality of electrical wires 15 are routed in a direction in which oil 11 flows.

With the above-described configuration, the oil 11 that has flowed down to the wire harness 14 gently flows along gaps between the plurality of electrical wires 15. Thus, when oil 11 flows on the wiring board 17, oil bubbles are prevented from being generated due to air being enclosed in oil 11.

Also, according to the present embodiment, the filter 30 is disposed above the wire harness 14.

With the above-described configuration, oil bubbles contained in the oil 11 that falls onto the filter 30 are removed by the filter 30, and therefore, oil 11 from which oil bubbles have been removed flows down from below the filter 30. Thus, it is possible to reduce the number of oil bubbles contained in the oil 11.

Also, according to the present embodiment, the filter 30 is disposed between the rectifying member 39 and the wire harness 14.

As the filter 30 is disposed below the rectifying member 39, the oil 11 that flows down to the filter 30 is first decelerated by the rectifying plates 43 of the rectifying member 39. Consequently, the flowing speed of oil 11 is small when the oil 11 comes into contact with the filter 30. Therefore, air is prevented from being enclosed in oil 11 due to oil 11 coming into contact with the filter 30. As a result, oil bubbles are prevented from being generated. Also, oil 11 is further decelerated upon the oil 11 passing through the filter 30. Therefore, when oil 11 flows down to the wire harness 14 that is located below the filter 30, air is further prevented from being enclosed in oil 11. As a result, oil bubbles are further prevented from being generated.

Also, according to the present embodiment, the filter 30 is attached to the frame 34 that includes the outer frame 35 and the bars 36 that are provided inside the outer frame 35.

With the above-described configuration, the outer frame 35 and the bars 36 retain the shape of the filter 30. Therefore, the filter 30 is prevented from deforming due to the pressure of the oil 11 that has flowed down. Thus, it is possible to reliably reduce the number of oil bubbles contained in the oil 11.

Second Embodiment

Figure 11:
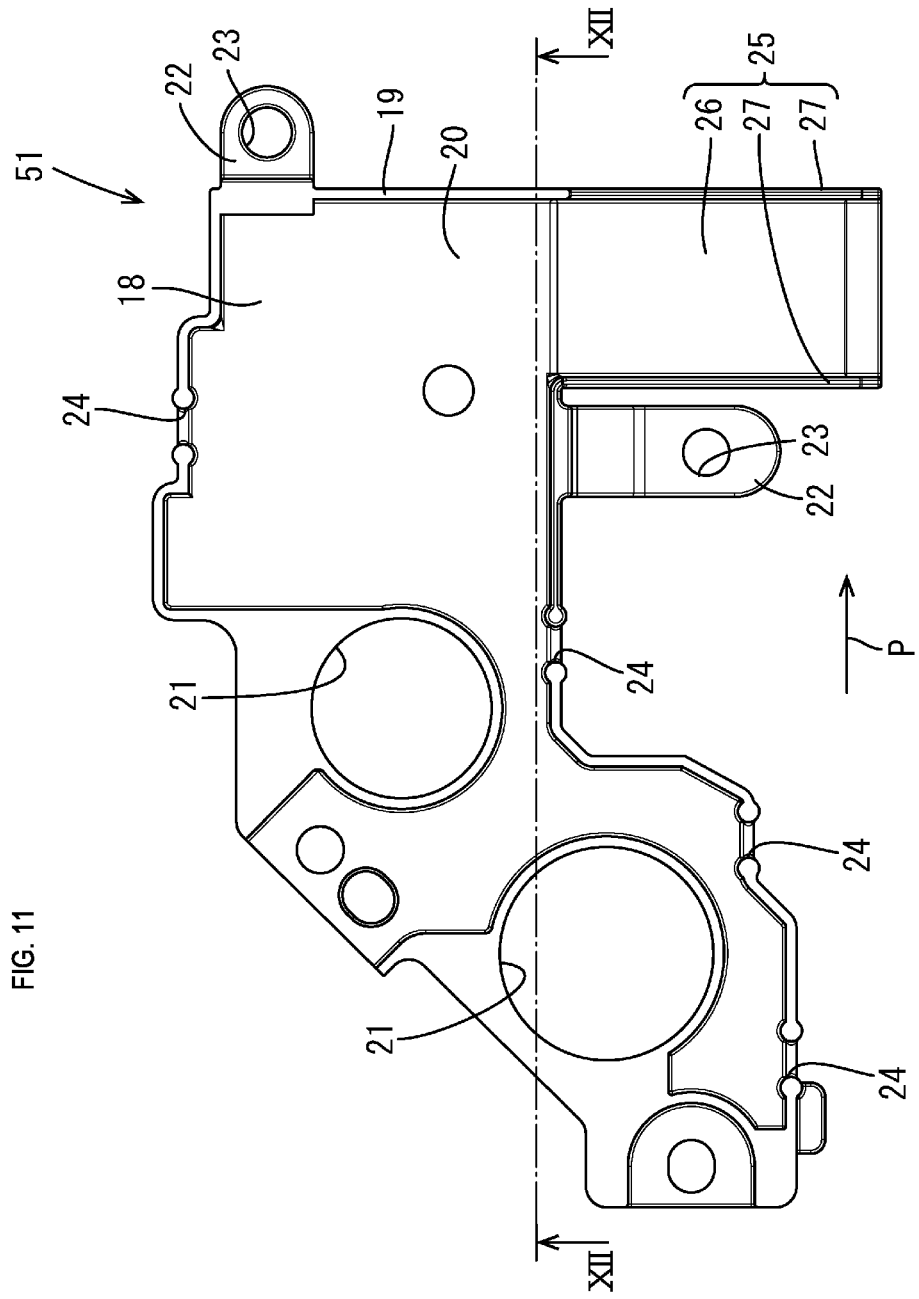
FIG. 11 is a plan view showing a wiring board according to a second embodiment.
Figure 12:
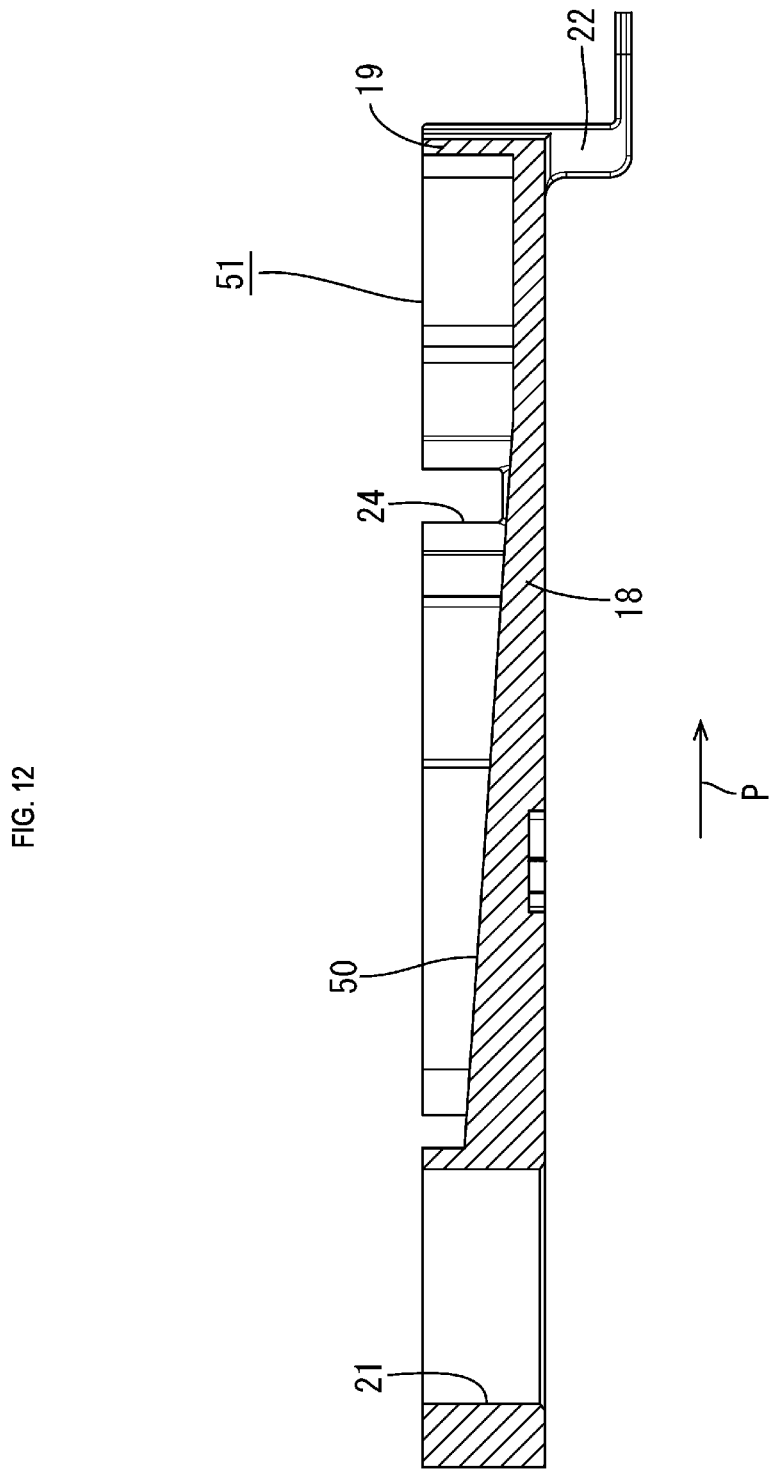
FIG. 12 is a cross-sectional view along a line XII-XII in FIG. 11.

The following describes a second embodiment of the technology disclosed in the present specification, with reference to FIGS. 11 and 12.

FIG. 12 is a cross-sectional view along a line XII-XII in FIG. 11. As shown in FIG. 12, the upper surface of the bottom wall 18 of a wiring board 51 is provided with a guide inclined surface 50 that is inclined downward in a direction toward a portion of the wiring board 51, the portion being provided with the inclined portion 25 (in a direction indicated by an arrow P in FIG. 12). As shown in FIG. 12, a direction toward the portion of the wiring board 51 where the inclined portion 25 is provided is the direction indicated by the arrow P.

Components other than above are substantially the same as those in the first embodiment. Therefore, the same components are assigned the same reference numerals and duplicate descriptions are omitted.

According to the present embodiment, the oil 11 that has flowed down to the wiring board 51 flows along the guide inclined surface 50, and is swiftly guided to the inclined portion 25. Thus, oil 11 is prevented from being retained on the upper surface of the wiring board 51. Therefore, oil 11 is prevented from flowing down from a side edge where the inclined portion 25 is not provided, from among the side edges of the wiring board 51. As a result, oil bubbles are prevented from being generated due to air being enclosed in the oil 11 that has flowed down from the side edge where the inclined portion 25 is not provided, from among the side edges of the wiring board 51.

OTHER EMBODIMENTS

The technology disclosed in the present specification is not limited to the embodiments that have been described based on the descriptions above and the drawings, and, for example, the following embodiments are included in the technical scope of the technology disclosed in the present specification.

In the embodiments, the filter 30 is interposed between the wiring board 17 and the rectifying member 39. However, the filter 30 may be omitted.

In the embodiments, the filter 30 is fixed to the frame 34. However, the frame 34 may be omitted. If this is the case, the filter 30 may be fixed to the upper surface or the lower surface of the rectifying member 39.

In the embodiments, the leading end of the inclined portion 25 is provided with the flow moderation portion 29. However, the flow moderation portion 29 may be omitted.

The wiring unit 10 according to the embodiments is attached in the automatic transmission. However, the technology disclosed in the present specification is not limited to such a configuration, and may be applied to a wiring unit 10 that is used under circumstances in which oil 11 falls onto the wiring unit 10 from above.

In the embodiments, the wire harness 14 is routed on the wiring board 17. However, such a configuration is not essential, and the wiring board 17 may be omitted.

In the embodiments, the rectifying plates 43 are formed integrally with the rectifying member 39. However, such a configuration is not essential, and rectifying plates 43 that are separate from the outer frame 35 may be attached to the outer frame 35.

In the embodiments, the main discharge port 24A is provided with the inclined portion 25. However, such a configuration is not essential, and all of the discharge ports of the wiring board 17 may be provided with an inclined portion.

What is claimed is:

1. A wiring unit comprising:
    a wire harness; and
    a rectifying member that is located above the wire harness, the rectifying member including a plurality of rectifying plates spaced apart from each other so as to define a plurality of through-holes extending between an open top and an open bottom of the rectifying member, and wherein at least one of the plurality of rectifying plates has a plate surface that is inclined relative to a vertical direction.

2. The wiring unit according to claim 1,
    wherein the wire harness is routed on a wiring board, and the wiring board is provided with an inclined portion that protrudes outward from a side edge of the wiring board and has an inclined surface that is inclined downward in a direction toward a leading end of the inclined portion.

3. The wiring unit according to claim 2, wherein oil is retained below the wiring board, and the inclined portion is provided with a flow moderation portion that hangs from the leading end of the inclined portion and whose lower end portion is located in the oil.

4. The wiring unit according to claim 2, wherein a routing portion, on which the wire harness is routed, of the wiring board is provided with a guide inclined surface that is inclined downward in a direction toward a portion of the wiring board, the portion being provided with the inclined portion.

5. The wiring unit according to 1, wherein the wire harness includes a plurality of electrical wires, and the plurality of electrical wires are routed in a direction in which oil flows.

6. The wiring unit according to claim 1, wherein a filter is provided above the wire harness, the filter being dimensioned so as to be seated underneath the plurality of through-holes of the rectifying member.

7. The wiring unit according to claim 6, wherein the filter is disposed between the rectifying member and the wire harness.

8. The wiring unit according to claim 6, wherein the filter is attached to a frame that includes an outer frame and a bar that is provided inside the outer frame.

9. The wiring unit according to claim 3, wherein a routing portion, on which the wire harness is routed, of the wiring board is provided with a guide inclined surface that is inclined downward in a direction toward a portion of the wiring board, the portion being provided with the inclined portion.

10. The wiring unit according to claim 2, wherein the wire harness includes a plurality of electrical wires, and the plurality of electrical wires are routed in a direction in which oil flows.

11. The wiring unit according to claim 3, wherein the wire harness includes a plurality of electrical wires, and the plurality of electrical wires are routed in a direction in which oil flows.

12. The wiring unit according to claim 4, wherein the wire harness includes a plurality of electrical wires, and the plurality of electrical wires are routed in a direction in which oil flows.

13. The wiring unit according to claim 2, wherein a filter is provided above the wire harness.

14. The wiring unit according to claim 3, wherein a filter is provided above the wire harness.

15. The wiring unit according to claim 4, wherein a filter is provided above the wire harness.

16. The wiring unit according to claim 5, wherein a filter is provided above the wire harness.

17. The wiring unit according to claim 7, wherein the filter is attached to a frame that includes an outer frame and a bar that is provided inside the outer frame.

* * * * *